United States Patent [19]

Casto

[11] Patent Number: 5,014,113
[45] Date of Patent: May 7, 1991

[54] MULTIPLE LAYER LEAD FRAME

[75] Inventor: James J. Casto, Austin, Tex.

[73] Assignee: Motorola, Inc., Schaumburg, Ill.

[21] Appl. No.: 457,444

[22] Filed: Dec. 27, 1989

[51] Int. Cl.$^5$ ............ H01L 23/48; H01L 23/54
[52] U.S. Cl. ........................ 357/70; 174/52.4
[58] Field of Search ............... 357/70; 174/52.4

[56] References Cited

U.S. PATENT DOCUMENTS

| 3,627,901 | 12/1971 | Happ | 174/52 PE |
| 4,496,965 | 1/1985 | Orcutt et al. | 357/70 |

FOREIGN PATENT DOCUMENTS

| 59-61155 | 4/1984 | Japan | 357/70 |
| 60-92646 | 5/1985 | Japan | 357/70 |
| 61-12053 | 1/1986 | Japan | 357/70 |
| 62-54456 | 3/1987 | Japan | 357/70 |
| 1-137660 | 5/1989 | Japan | 357/70 |

Primary Examiner—Rolf Hille
Assistant Examiner—S. V. Clark
Attorney, Agent, or Firm—John A. Fisher

[57] ABSTRACT

A lead frame having multiple layers permits fine connection to a large number of bonding pads on an electronic component such as an integrated circuit (IC), but strong external package leads. A fully featured or completely extensive lead frame layer bears proximal ends that may be finely dimensioned for connection with the bonding pads of an IC. A second frame layer is laminated with the first layer, but does not have proximal ends that extend as far as those of the fully featured frame layer. The doubled external leads for mounting to a printed circuit board (PCB) are relatively stronger than the single, more finely featured proximal lead ends that are bonded to the component. The lead frame layers may also differ with respect to their thicknesses, electrical conductivity, strength and solder-wetting characteristics.

16 Claims, 2 Drawing Sheets

5,014,113

MULTIPLE LAYER LEAD FRAME

CROSS-REFERENCE TO RELATED APPLICATION

This application is related to U.S. patent application Ser. No. 457,630, filed of even date, which relates to electronic packages using a tape frame that is intermediate in an interconnection structure between wire bonds from an electronic component and a lead frame.

FIELD OF THE INVENTION

The invention relates to packages for electronic devices, and, in one aspect, more particularly relates to packages and containers for electronic devices such as integrated circuits, for example, which provide fine connections to the bonding pads of the device, yet also possess sturdy exterior package leads.

BACKGROUND OF THE INVENTION

It is well known that an increasingly important consideration in the production and use of integrated circuits (ICs) is the package in which the IC resides. The module or casing in which the IC is packaged is an important factor in the ultimate cost, performance and lifetime of the IC. A significant concern as the circuits become denser is that the number of leads to the package and connections from the leads to the integrated circuit pads increases; thus increasing the complexity of construction and adding to the cost of the end product, not just in terms of increased and more expensive materials, but also increased production costs.

The use of conventional, relatively heavy or robust lead frames for integrated circuits or other devices having high input/output (I/O) count is a problem because the inner portions of the leads are limited by their thickness in how closely they may be spaced. It has been proposed to narrow the interior portions of these leads, but this requires special machining or etching of the leads or special tooling.

Tape automated bonding (TAB) has also been extensively studied as a technique for providing very fine connections to the bonding pads of an IC chip. However, TAB tape has the disadvantage at the opposite end of the lead, namely the distal or external leads extending from the package are very fragile and easily damaged and difficult to mount to the printed circuit board (PCB) mounting pads. Additionally, to make the TAB connection directly to the IC bonding pads, the bonding pads, the inner ends of the delicate TAB leads or both must be provided with bonding bumps of gold, copper, tin, or mixtures thereof, or the like, to make an adequate connection. Providing bumps on the chip or the leads has always proved difficult because of their fine pitch for the chips with high numbers of bonding pads (I/O count).

Even the use of conventional wire bonds has proven less than desirable as the connection count has risen. As the number of required connections has grown, the distance from the bonding pads to the inner lead tips has increased, in turn increasing the wire bond lengths. Long wire bond lengths are not preferred because susceptibility to damage during assembly and wire sweep during the mold operation. During encapsulation or molding, the mold compound sweeps over the wires tends to push them. If they are long enough, they may contact each other or the IC chip and cause shorting, which affects circuit performance.

Thus, a continuing goal in the art of providing packages for electronic components such as integrated circuits is a package design that will address these multiple goals satisfactorily in an arrangement that can be reliably manufactured at the lowest cost. The lowest cost packages are those which have plastic bodies which can be molded from thermoplastic and thermoset materials.

SUMMARY OF THE INVENTION

Accordingly, it is an object of the present invention to provide an integrated circuit package design that will permit the package to have a large number of interconnections, that is, a high I/O count, while having finely dimensioned connections to the IC, but more robust exterior package leads.

It is another object of the present invention to provide an IC package design with leads that can have a variety of characteristics for different assembly purposes and environments.

Still another object of the invention is to provide an electronic component package with a high I/O count that can be readily manufactured using available techniques and in a number of different ways.

In carrying out these and other objects of the invention, there is provided, in one form, an electronic package having an electronic component with a plurality of bonding pads thereon, and a multiple layer lead frame. The lead frame has a first frame layer with leads having proximal ends near the electronic component, distal ends away from the electronic component and a lead body between the proximal and distal ends. The lead frame also has a second frame layer bonded to the first frame layer and coextensive with a majority of the distal end thereof and at least a portion of the lead body, where the second frame layer is absent from the proximal ends of the first frame layer. Electrical connections are present between the bonding pads of the electronic component to the proximal ends of the first frame layer. A package body encapsulates the electronic component, the proximal ends, and a portion of the lead body, where the distal ends extend from the package body.

It will be appreciated in the Figures that the proportions of the various parts are not to scale. For example, the thicknesses of various components such as layers, leads and components in FIG. 1 have been exaggerated for clarity. Additionally, it will be understood that in FIGS. 2 and 3, only a very few leads are illustrated for clarity; an actual lead frame may have hundreds of leads.

DETAILED DESCRIPTION OF THE INVENTION

As noted, packaging present electronic components, such as ICs, having a large number of bonding pads with a single lead structure has proven difficult. If a conventional lead frame is used, the interior or proximal ends of the leads are not fine enough to reach closely to the bonding pads. Additionally, when a conventional lead frame is used, the wire bond lengths from the pads to the inner lead tips becomes so long as to be subject to damage or shorting. The lead frame as a whole can be shrunk, such as in the case where tape automated bonding (TAB) frames are used, so that the proximal or interior ends of the leads are sufficiently small to even bond directly to the component. However, then the external or distal lead ends extending from the package body are fragile, easy to damage and difficult to maintain in coplanarity for PCB bonding, particularly surface mounting.

Prior attempts to solve this problem involve modifying a conventional lead frame by machining, etching or otherwise forming the proximal ends so that they are thinner and narrower so that they may be packed closer together and closer to the component. Some suggest that this reduction in size can be so successful as to permit direct bonding of the proximal ends to the bonding pads. However, this approach requires extensive custom modification of the lead frames.

Figure 1:
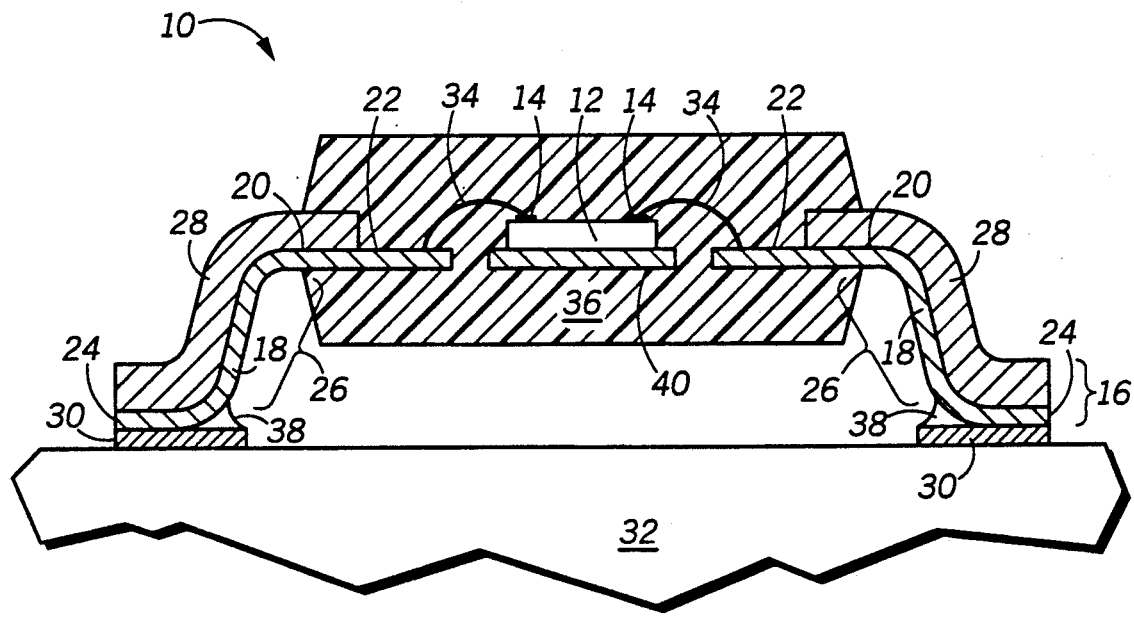
FIG. 1 is a sectional, profile view of an electronic package of the present invention.

It has been discovered that the use of a multiple layer lead frame accomplishes the objectives of providing both fine proximal ends and sturdy external leads with considerably fewer extraordinary measures than found in prior attempts at achieving this goal. Shown in FIG. 1 is a cross-section of an electronic package 10 in profile, such as a surface mount, gull-wing package, having an electronic component 12, such as an integrated circuit, with a plurality of bonding pads 14 thereon. The component 12 is surrounded by a multiple layer lead frame 16 (see also FIGS. 2 and 3) having a first frame layer 18 with leads 20 having proximal ends 22 near the IC chip 12, distal ends 24 away from the chip 12 and on opposite ends of the leads 20 from proximal ends 22, and a lead body 26 generally between the proximal ends 22 and the distal ends 24.

Multiple layer lead frame 16 also possesses at least a second frame layer 28 bonded to the first frame layer 18, which second frame layer 28 is coextensive with a majority, if not all, of the length of the distal end 24, at least a portion of the lead body 26, but is absent from the proximal end 22. It will be appreciated that the extent of the proximal ends 22, distal ends 24 and body 26 cannot be defined with precision and may be regarded as somewhat overlapping. Their extent along the length of the lead 20 will vary from package to package and will vary with such factors as the size of the component 12, the size of the package 10, the exterior lead type, the bonding techniques used to connect to the component 12, etc. The proximal end 22 may be generally thought of as the area of the lead 20 involved in bonding to the bonding pads 14 of component 12. The proximal ends 22 should generally have fine or small dimensions and be flexible, and able to have a very fine pitch and come close to the bonding pads 14, if not be able to be directly bonded to the bonding pads 14. The distal ends 24 may be generally regarded as the portion of leads 20 involved in bonding to lands 30 of a printed circuit board (PCB) 32. They may have a straight configuration, or in some cases, the distal ends 24 may be shaped. For example, in the particular embodiment of FIG. 1, the distal ends 24 form the outermost portion of a gull-wing type lead. Of course, it will be appreciated that the invention is not limited to a particular lead configuration and that other lead shapes, such as butt joint, J-lead, etc. may be employed. The body portion 26 of the lead 20 is any area between the proximal end 22 and the distal end 24.

Second frame layer 28 then should not be present at all on the proximal ends 22, since one of the purposes of the second frame layer 28 is to add strength and rigidity to the lead, which are properties not desired at the proximal ends 22. Thus, second frame layer 28 should be present on at least a portion of the body 26 and a majority of the distal end 24. However, it will be appreciated that a version of the invention can be envisioned where the second frame layer 28 is not required on all of the distal end 24 and may be omitted to save on material.

Returning to the general discussion of the package 10, electrical connections are made between the bonding pads 14 and the proximal ends 22 of the leads 20 of the first frame layer 18. These connections may be made by wire bonds 34 as illustrated in FIG. 1, or may be direct bonds using bumps of gold or other material, or TAB leads, etc.; any suitable mechanism. A package body 36 encapsulates the electronic component 12, the proximal ends 22, and at least a portion of the lead body 26. The second frame layer 28 may not necessarily be partially encompassed by the body 36; it will depend on where the strength is needed along the lead 20. Distal ends 24, at least, should be completely free of the package body 36. Subsequent to package 10 fabrication, the package 10 is mounted on PCB 32 by contacting distal ends 24 with lands 30 and bonding together in a suitable manner, including, but not limited to solder joints 38. The package may optionally have a die bond flag 40 that is part of first frame layer 18, which supports the electronic component 12 in proper relationship with respect to proximal ends 22 of leads 20.

Figure 2:
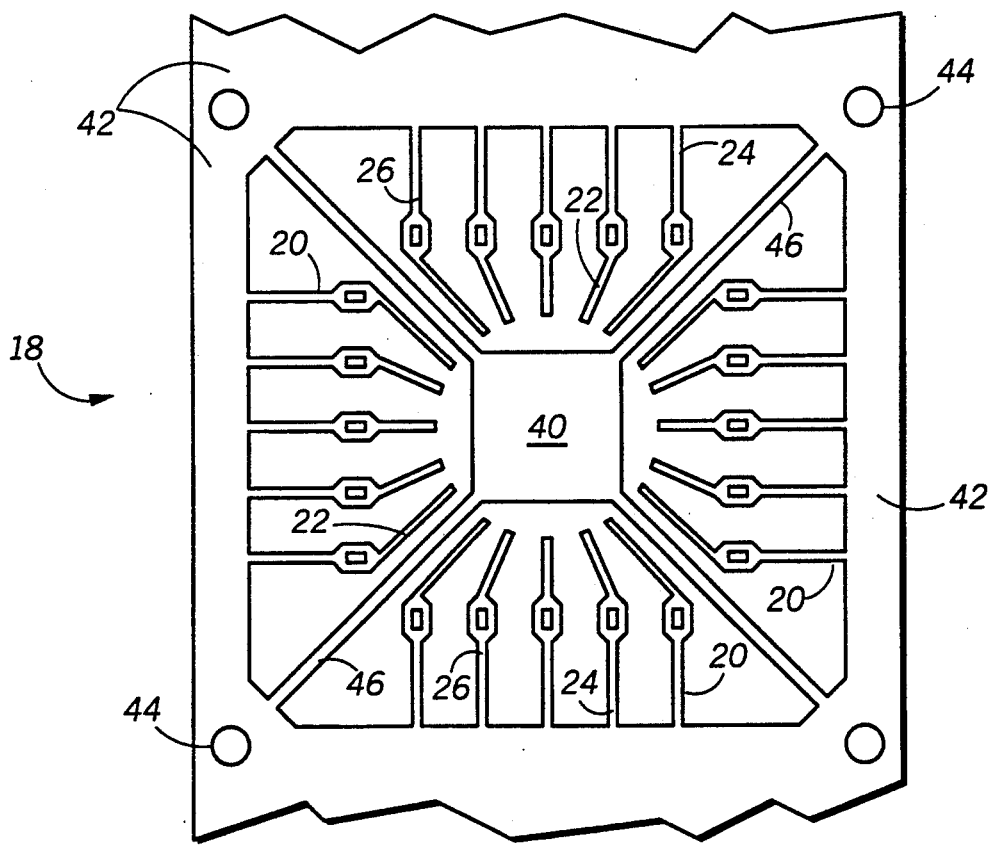
FIG. 2 is a plan view of a more fully featured or completely extensive frame layer used in connection with the multiple layer lead frame of the invention.
Figure 3:
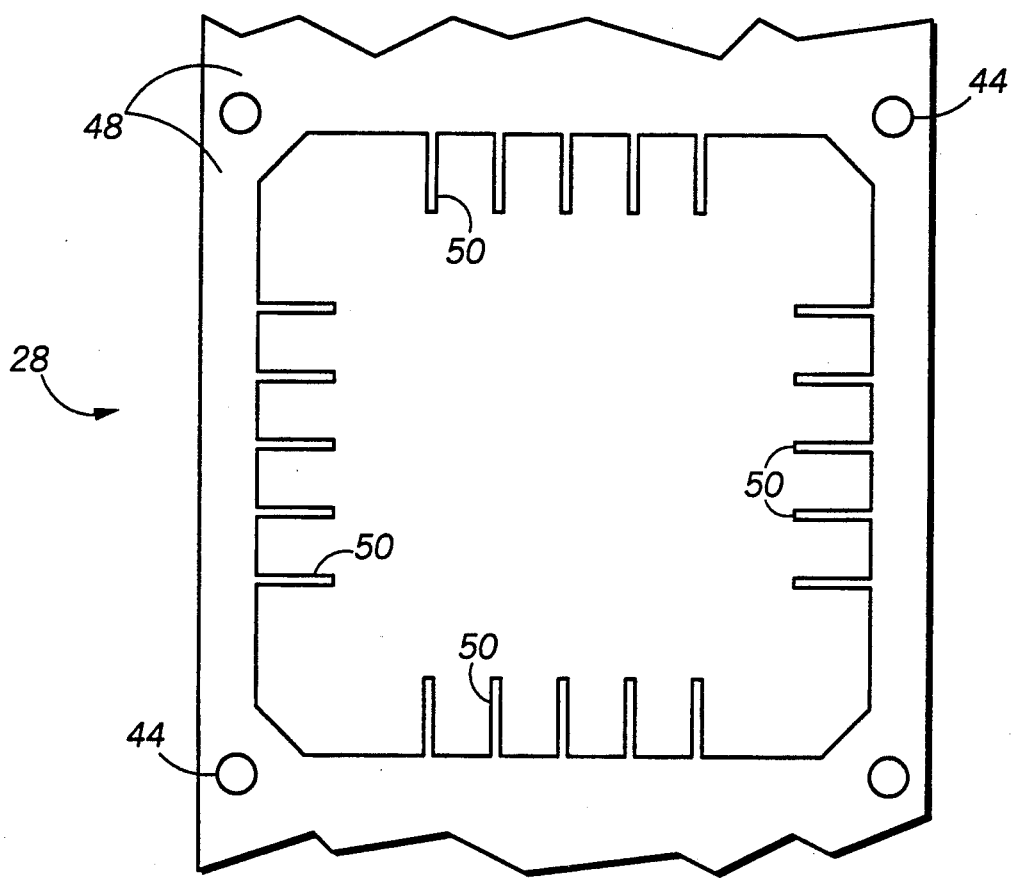
FIG. 3 is a less featured frame layer to be used with the completely extensive frame layer of FIG. 2 to make up a multiple layer lead frame of the present invention.

The multiple lead frame 16 will be further illustrated with respect to FIGS. 2 and 3 which show plan views of first frame layer 18 and second frame layer 28, respectively, depicting their similarities and differences. In FIG. 2, first frame layer 18 is depicted with is periphery frame 42 which holds leads 20 in position with respect to each other during the assembly process. Periphery frame 42 is sheared away after the package body 36 is provided and prior to forming the distal ends 24 of the leads 20. In this view, the leads 20 would be flat. Layer 18 with periphery 42 may be provided in strip form, in the manner of frames on movie film, and may be registered for automated assembly in a conventional fashion using sprocket holes 44.

It will be appreciated that layer 18 is a fully featured or completely extensive layer, that is, the lead portions extend the maximum length. First frame layer 18 extends from proximal ends 22 through body 26 to distal ends 24. If a die bond flag 40 is present as a part of first layer 18, tie bars 46 must be provided to hold the flag 40 in correct position relative to the leads 20. Tie bars 46 are also sheared away after the package body 36 is provided. However, usually this shearing step is the last one performed after testing, etc.

By way of contrast, FIG. 3 depicts the second frame layer 28 that would correspond to first frame layer 18 of FIG. 2. A periphery frame 48 is also present here, but note that the second frame layer leads 50 extend a distance that only corresponds to the distal ends 24 and part of the lead bodies 26 of the first frame layer 18. Frame periphery 48 and second frame layer 28 may also be registered using corresponding sprocket holes 44. Indeed, the sprocket holes of both strips may be used to register the layers 18 and 28 with respect to each other prior to laminating or other layer bonding, as will be described below. The widths of the leads 20 and 50 of the first frame layer 18 and the second frame layer 28, respectively, are shown to be about the same in FIGS. 2 and 3. However, it will be appreciated from FIG. 3 that since the pitch of leads 50 is relatively wide that these leads 50 themselves could be made relatively wider than leads 20.

Multiple layer lead frame 16 may provide a variety of functions. It has already been noted that since the body 26 and distal ends 24 are reinforced by second frame layer 28, the outside portion of leads 20, certainly the distal parts used in bonding to a PCB 32, are relatively stronger and more sturdy than simply the first frame layer 18, and may thus withstand the rigors of handling and assembly. Yet proximal ends 22 have only the thickness of first layer 18, and thus may be relatively finer permitting a close pitch near the electronic component 12 for a large number of electrical connections. As depicted in FIG. 1, second frame layer 28 may also be designed to be appreciably thicker than first frame layer 18 to add additional strength to the lead portions extending from package body 36. In one non-limiting example, first frame layer may range from about 1 to about 5 mils thick, and second frame layer may range from about 4 to about 10 mils in thickness. Suitable materials for the frame layers include, but are not limited to, Kovar, Alloy 42, copper, gold, aluminum, other alloys and combinations, etc.

Other functions may also be served, however. For example, second frame layer 28 may be made out of an inherently stronger material than frame 18, even though they may both be of the same thickness. First frame layer 18 may be relatively more electrically conductive than second frame layer 28 so as to channel current flow more directly to through the circuit. First frame layer 18 may be more readily wettable by solder than second frame layer 28. This characteristic would help keep the solder at bond 38 (FIG. 1) and prevent the solder from uselessly wicking onto layer 28. These layers may have more than one of these functions simultaneously. It will be further understood that the lead frame of the invention is not limited to two layers, and that more than two layers may be served, each serving one of the above or different functions.

It will be appreciated that a concern of the multiple layer lead frame 16 is the lamination of the two layers 18 and 28. It is preferred that the two or more layers have similar coefficients of thermal expansion so that upon heating the layers will not expand at different rates and form shear stresses that may cause the lead frame to delaminate. A number of different methods are expected to be suitable in laminating the lead frames of the present invention, including, but not limited to, resistance welding, "spot" welding, pre-plating the frames with solder and reflowing the solder to "weld" the frames together. The laminated multiple lead frame must be able to avoid delamination during the lead forming step as well. It will also be understood that with some laminations, certain exterior lead forms may cause more delamination problems than other shapes.

At least five different process flows may be envisioned to produce the lead frames useful in the electronic packages of this invention:

Process Flow 1 a. Etch or stamp two lead frames which are identical.

b. Cut or stamp out the center of one frame to form the second frame layer. The non-modified frame forms the first layer.
c. Laminate the two layers together.
d. Assemble the package.

Process Flow 2 a. Etch two different lead frames: first frame layer and second frame layer.
b. Laminate the two layers together.
c. Assemble the package.

Process Flow 3 a. Stamp first frame, full featured layer.
b. Stamp second frame with same tool as for step a., but remove punches for leads and replace them with a punch to stamp out the center.
c. Laminate the two layers together.
d. Assemble the package.

Process Flow 4 a. Stamp alignment features only in the strip for first frame layer.
b. Stamp alignment features and cut out center section in the strip for second frame layer.
c. Laminate the two layers together.
d. Stamp remaining details on the laminated assembly.
e. Assemble the package.

Process Flow 5 a. Produce two different frame layers by stamping or etching.
b. Assemble the package through the wire bond step with only the first frame layer.
c. Mold the two different frame layers together.

It will be appreciated that the package of this invention may be fabricated with conventional technologies. More importantly, in Process Flows 1 through 4 above, once the multiple layer lead frame is produced, the assembly of the package is entirely by conventional techniques. An important advantage of the multiple layer lead frames of the present invention is that the second frame layer may be standard for an entire family of packages. Only the first frame layer need be custom produced for each particular package within the family. Since second frame layers may be stamped, they may be relatively cheaply produced. Thus, it may be seen that the inventive electronic packages possess the advantages of packages with thin lead frames and those with thick lead frames, with none of the disadvantages of either and few production concerns.

Many modifications may be made in the structure and process of the present invention without departing from the scope thereof. For example, the various features of the invention may be combined in a way not explicitly illustrated herein. It is anticipated that the packages of this invention could be made from premolded piece parts, even ceramic parts that are sealed together around the lead frame using suitable and/or conventional frit glass compounds, rather than injection molded or by other techniques. It is conceivable that the second frame layer could be made out of a non-metallic material with the particular properties desired, such as an elastomer or other substance.

I claim:
1. A packaged electronic device comprising:
an electronic component having a plurality of bonding pads thereon;

a multiple layer lead frame having
 a first frame layer with leads having proximal ends near the electronic component, distal ends away from the electronic component and a lead body between the proximal and distal ends; and
 a second frame layer bonded and electrically coupled to the first frame layer and coextensive with a majority of the distal end thereof and at least a portion of the lead body, where the second frame layer is absent from the proximal ends of the first frame layer;
electrical connections between the bonding pads of the electronic component and the proximal ends of the first frame layer; and
a package body encapsulating the electronic component, the proximal ends, and a portion of the lead body, where the distal ends extend from the package body.

2. The packaged electronic device of claim 1 where the electronic component is supported by a die bond flag that is part of the first frame layer.

3. The packaged electronic device of claim 1 where the second frame layer is relatively thicker than the first frame layer.

4. The packaged electronic device of claim 1 where the first frame layer is relatively more electrically conductive than the second frame layer.

5. The packaged electronic device of claim 1 where the first frame layer is relatively more solder wettable than the second frame layer.

6. The packaged electronic device of claim 1 where the first frame layer and the second frame layer have similar coefficients of thermal expansion.

7. A packaged electronic device comprising:
a multiple layer lead frame having
 a first frame layer having a die bond flag with leads having proximal ends near the die bond flag, distal ends away from the die bond flag and a lead body between the proximal and distal ends; and
 a second frame layer bonded and electrically coupled to the first frame layer and coextensive with a majority of the distal end thereof and at least a portion of the lead body, where the second frame layer is absent from the proximal ends of the first frame layer, and where the second frame layer is relatively thicker than the first frame layer;
an electronic component having a plurality of bonding pads thereon, where the electronic component is bonded to the die bond flag;
electrical connections between the bonding pads of the electronic component and the proximal ends of the first frame layer; and
a package body encapsulating the electronic component, the proximal ends, and a portion of the lead body, where the distal ends extend from the package body.

8. The packaged electronic device of claim 7 where the first frame layer is relatively more electrically conductive than the second frame layer.

9. The packaged electronic device of claim 7 where the first frame layer is relatively more solder wettable than the second frame layer.

10. The packaged electronic device of claim 7 where the first frame layer and the second frame layer have similar coefficients of thermal expansion.

11. A family of packaged electronic devices, each device comprising:
an electronic component having a plurality of bonding pads thereon;
a multiple layer lead frame having
 a first frame layer with leads having proximal ends near the electronic component, distal ends away from the electronic component and a lead body between the proximal and distal ends, where the first frame layer is different from device to device within the family; and
 a second frame layer bonded and electrically coupled to the first frame layer and coextensive with a majority of the distal end thereof and at least a portion of the lead body, where the second frame layer is absent from the proximal ends of the first frame layer, and where the second frame layer is the same for each device within the family;
electrical connections between the bonding pads of the electronic component to the proximal ends of the first frame layer; and
a package body encapsulating the electronic component, the proximal ends, and a portion of the lead body, where the distal ends extend from the package body.

12. The family of packaged electronic devices of claim 11 where the electronic component is supported by a die bond flag that is part of the first frame layer.

13. The family of packaged electronic devices of claim 11 where the second frame layer is relatively thicker than the first frame layer.

14. The family of packaged electronic devices of claim 11 where the first frame layer is relatively more electrically conductive than the second frame layer.

15. The electronic package of claim 11 where the first frame layer is relatively more solder wettable than the second frame layer.

16. The electronic package of claim 11 where the first frame layer and the second frame layer have similar coefficients of thermal expansion.

* * * * *